United States Patent
Raghunathan et al.

(10) Patent No.: US 8,362,848 B2
(45) Date of Patent: Jan. 29, 2013

(54) SUPPLY-REGULATED VCO ARCHITECTURE

(75) Inventors: Ashwin Raghunathan, Santa Clara, CA (US); Marzio Pedrali-Noy, San Diego, CA (US); Sameer Wadhwa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 40 days.

(21) Appl. No.: 13/082,313

(22) Filed: Apr. 7, 2011

(65) Prior Publication Data
US 2012/0256693 A1 Oct. 11, 2012

(51) Int. Cl.
*H03L 1/00* (2006.01)
*H03L 7/099* (2006.01)
*H03K 3/03* (2006.01)

(52) U.S. Cl. ............. 331/186; 331/34; 331/50; 331/57; 327/156; 327/158

(58) Field of Classification Search .............. 331/2, 8, 331/16, 17, 34, 46–50, 55, 57, 108 R, 177 R, 331/185, 186; 327/147, 149, 156, 158; 375/373, 375/376
See application file for complete search history.

(56) References Cited

U.S. PATENT DOCUMENTS

| | | | | |
|---|---|---|---|---|
| 6,456,166 B2 * | 9/2002 | Yabe | ................................ | 331/34 |
| 6,525,613 B2 * | 2/2003 | Cyrusian | ......................... | 331/17 |
| 7,336,134 B1 * | 2/2008 | Janesch et al. | ............. | 331/36 C |
| 7,710,207 B2 * | 5/2010 | Wu | ................................. | 331/57 |
| 7,724,092 B2 * | 5/2010 | Quan et al. | ..................... | 330/288 |
| 7,750,741 B2 * | 7/2010 | Kodato et al. | .................... | 331/17 |
| 7,863,987 B2 * | 1/2011 | Kanda et al. | ...................... | 331/2 |
| 7,961,056 B2 * | 6/2011 | Taylor et al. | .................... | 331/48 |
| 7,990,225 B1 * | 8/2011 | Guo et al. | ........................ | 331/17 |
| 2007/0159262 A1 | 7/2007 | Quan et al. | | |

FOREIGN PATENT DOCUMENTS

WO WO2010126845 A1 11/2010

OTHER PUBLICATIONS

Jung et al., "A 1.2mW 0.02mm2 2GHz Current-Controlled PLL Based on a Self-Biased Voltage-to-Current Converter," ISSCC Dig. Tech. Papers, pp. 310-605, Feb. 13, 2007.
Yan et al., "A Self-Biased PLL with Current-Mode Filter for Clock Generation," ISSCC Dig. Tech. Papers, pp. 420-421, Feb. 9, 2005.

(Continued)

*Primary Examiner* — Levi Gannon
(74) *Attorney, Agent, or Firm* — Kevin T. Cheatham (57) ABSTRACT

A supply-regulated VCO exhibits reduced or no supply sensitivity peaking. The VCO includes an oscillator whose supply current is regulated to control the oscillating frequency of the oscillator. A VCO input signal controls the supply current so that there is a relationship between the input signal and the oscillator output frequency. Power supply noise that might otherwise affect oscillator operation is shunted from a supply current input lead of the oscillator to ground by a bypass capacitor. In one example, an auxiliary circuit supplies an auxiliary supply current to the oscillator, thereby reducing the amount of supply current a supply regulation control loop circuit must supply. In another example, a supply regulation control loop circuit supplies a control current to a main oscillator, but the bypass capacitor is not coupled to this oscillator but rather is coupled to a slave oscillator that is injection locked to the main oscillator.

31 Claims, 10 Drawing Sheets

OTHER PUBLICATIONS

Alon et al., "Replica Compensated Linear Regulators for Supply-Regulated Phase-Locked Loops," IEEE J. Solid State Circuits, vol. 41, No. 2, pp. 413-424, Feb. 2006.

Sidiropoulos et al, "Adaptive Bandwidth DLLs and PLLs Using Regulated Supply CMOS Buffers," 2000 Symposium on VLSI Circuits Dig. Tech. Papers, pp. 124-127, Jun. 2000.

Mesgarzadeh et al., "First Harmonic Injection-Locked Ring Oscillators," IEEE 2006 Custom Integrated Circuits Conference, pp. 733-736, 2006.

Razavi, "A Study of Injection Locking and Pulling in Oscillators," IEEE J. Solid State Circuits, vol. 39, No. 9, pp. 1415-1424, Sep. 2004.

Arakali et al., "Low-Power Supply-Regulation Techniques for Ring Oscillators in Phase-Locked Loops Using a Split Tuned Architecture," IEEE J. Solid State Circuits, vol. 44, No. 8, pp. 2169-2181, Aug. 2009.

Feng Z et al., "A Low Latency Transceiver Macro with Robust Design technique for Processor Interface", Solid-State Circuits Conference, 2009. A-SSCC 2009. IEEE Asian, IEEE, Piscataway, NJ, USA, Nov. 16, 2009, pp. 185-188, XP031582900.

Gurumoorthy V., et al., "Supply Regulation Techniques for Phase-locked Loops", Circuits and Systems Workshop,(DCAS), 2009 IEEE Dallas, IEEE, PI Scataway, NJ, USA, Oct. 4, 2009, pp. 1-4, XP031705972.

International Search Report and Written Opinion—PCT/US2012/032647—ISA/EPO Jul. 25, 2012.

Lee M J., et al., "Jitter Transfer Characteristics of Delay-Locked Loops-Theories and Design Techniques", IEEE Journal of Solid-State Circuits, IEEE Service Center, Piscataway, NJ, USA, vol. 38, No. 4, Apr. 1, 2003, pp. 614-621, XP001158201.

* cited by examiner

(PRIOR ART)

FIG. 4

(PRIOR ART)

SECOND EMBODIMENT

FIG. 10

HOW IASUP CURRENT VARIES WITH ICTRL
AND VCO FREQUENCY

SUPPLY-REGULATED VCO ARCHITECTURE

BACKGROUND INFORMATION

1. Technical Field

The present disclosure relates to Phase-Locked Loops (PLLs) that make use of a supply-regulated Voltage-Controlled Oscillator (VCO) architecture.

2. Background Information

Figure 1:
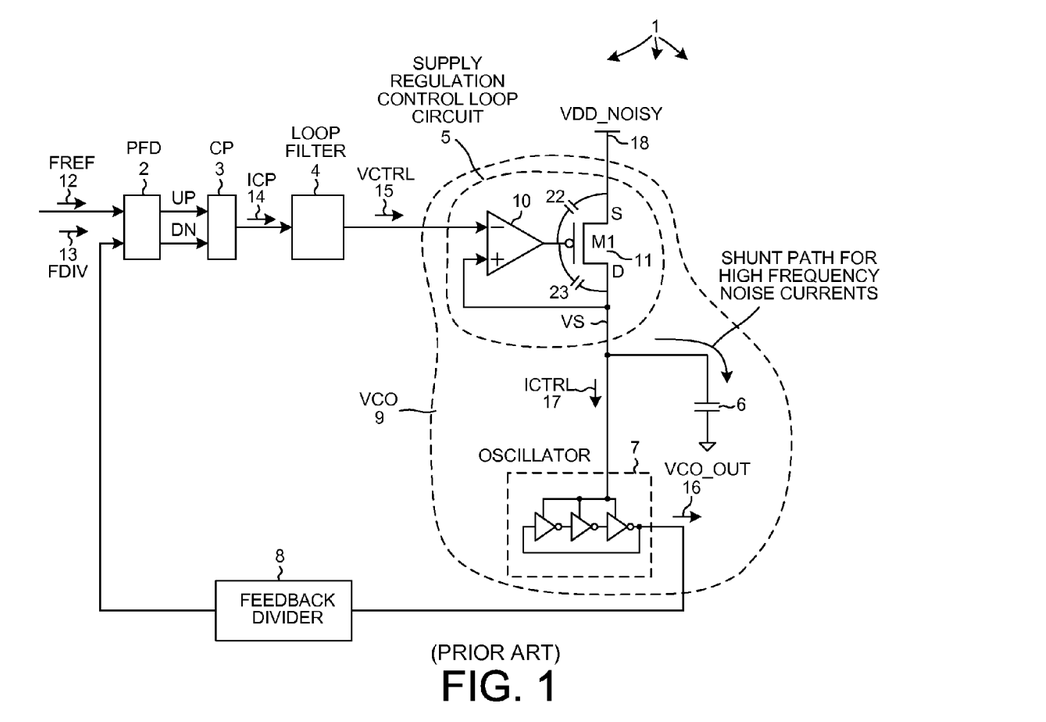
FIG. 1 (Prior Art) is a diagram of a PLL employing a first type of conventional supply-regulated Voltage-Controlled Oscillator (VCO).

A supply-regulated Phase-Locked Loop (PLL) generally involves a Voltage-Controlled Oscillator (VCO) whose oscillating frequency is determined and controlled by an input control signal such as a control voltage signal. FIG. 1 (Prior Art) is a diagram of one such PLL 1. PLL 1 involves a Phase-to-Frequency Detector (PFD) 2, a Charge Pump (CP) 3, a loop filter 4, a supply regulation control loop circuit 5, a bypass capacitor 6, an oscillator 7, and a feedback divider 8. The supply regulation control loop circuit 5, the oscillator 7, and the bypass capacitor 6 together form a VCO 9. Supply regulation control loop circuit 5 involves an operational amplifier 10 and a P-channel field effect transistor M1 11 interconnected as illustrated. PFD 2 compares the phase of a reference signal FREF 12 and the phase of a feedback signal FDIV 13 and outputs UP pulses or DN pulses depending on whether the phase of FDIV leads or leads or lags the phase of FREF. Charge pump 3 converts the pulses into a control current signal ICP 14. Control signal ICP 14 is filtered by loop filter 4 and is converted into a control voltage signal VCTRL 15. The supply regulation control loop circuit 5, the oscillator 7, and the bypass capacitor 6 together constitute a VCO because the oscillating frequency of the output signal VCO_OUT 16 of the oscillator is a function of the input control voltage signal VCTRL 15. The VCTRL signal is sometimes referred to as a fine tune signal and is denoted VTUNE. Oscillator 7 is an oscillator whose output signal VCO_OUT 16 has a frequency that is fairly proportional to the supply current ICTRL 17 supplied to the oscillator. If signal VCTRL 15 increases, then the control current ICTRL 17 supplied to the oscillator increases, and this causes the oscillating frequency of the oscillator output signal VCO_OUT 16 to increase. Similarly, if signal VCTRL 15 decreases, then the control current ICTRL 17 supplied to the oscillator decreases, and this causes the oscillating frequency of the oscillator output signal VCO_OUT 16 to decrease. The control loop operates to maintain the frequency and phase of VCO_OUT such that the phase and frequency of signal FDIV 13 as received by PFD 2 matches the frequency and phase of signal FREF 12 as received by PFD 2. When the PLL is in this state, the PLL is said to be in lock.

It is desired that signal ICTRL 17 be a function of the control voltage signal VCTRL 15 and only a function of the control voltage signal VCTRL 15. Unfortunately, there is often noise on the supply voltage VDD_NOISY at supply voltage conductor 18. This noise should not be allowed to affect oscillator operation. The supply regulation control loop circuit 5 operates to keep signal ICTRL 17 a function of control signal VCTRL 15, but the supply regulation control loop circuit has a limited bandwidth. High frequency noise VDD_NOISY that is of a frequency outside the bandwidth of the control loop can cause high frequency variations in the drain current of transistor M1 11. Accordingly, bypass capacitor 6 is provided to shunt such high frequency noise to ground so that oscillator 7 is not unduly affected by such noise.

Figure 2:
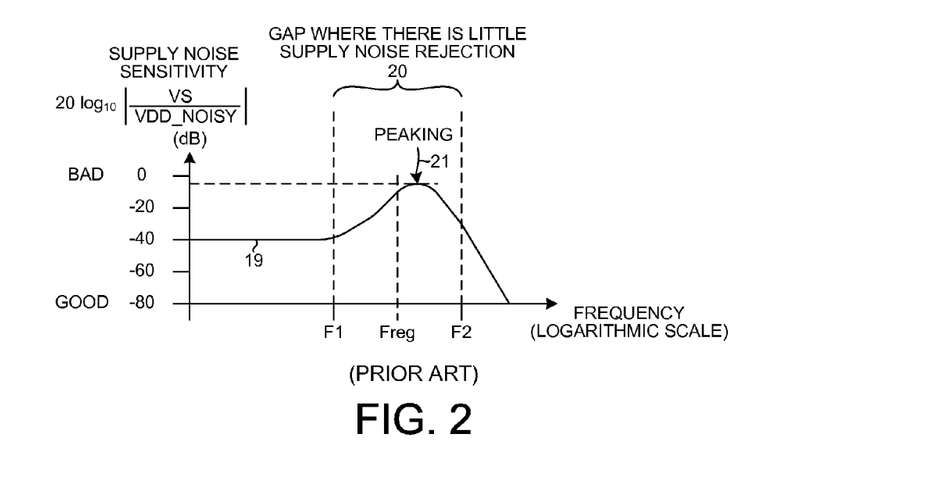
FIG. 2 (Prior Art) is a diagram that shows an operation of the supply-regulated VCO of FIG. 1.

FIG. 2 (Prior Art) illustrates a problem with the circuit of FIG. 1. Line 19 indicates how supply noise sensitivity varies as a function of frequency. Voltage VS is the regulated supply voltage on the common node at the supply current input lead of oscillator 7 and VDD_NOISY is the noisy supply voltage on supply voltage conductor 18. The supply regulation loop from the control voltage signal VCTRL 15 to the regulated supply voltage VS has two poles at frequencies F1 and F2. The dominant pole at frequency F1 is due to the parasitic capacitance associated with transistor M1 11 and the output resistance of operational amplifier 10. This dominant pole determines the upper frequency bound where the operational amplifier supply regulation control loop circuit no longer rejects supply voltage noise well. The operational amplifier supply regulation control loop rejects power supply noise relatively well for frequencies below frequency F1, but does not reject power supply noise so well for frequencies above frequency F1. F1 is approximately equal to ½π(ROUT*CP), where ROUT is the output resistance of the operational amplifier 10, and where CP is the effective parasitic capacitance associated with transistor M1.

There is a non-dominant pole at frequency F2 due to the bypass capacitor 6 and the effective resistance of the oscillator 7. Above frequency F2, the bypass capacitor 6 works relatively well in shunting supply voltage noise to ground but below the frequency F2 the bypass capacitor 6 does not shunt noise very well. Freg is the unity gain bandwidth of the operational amplifier. F2 is approximately ½π (RVCO*CBYCAP), where RVCO is the effective resistance of the ring oscillator, and where CBYCAP is the capacitance of the bypass capacitor 6. In order to achieve good power supply rejection at low frequencies, the gain of operational amplifier 10 is generally maximized which results in ROUT>>RVCO. This makes F1<F2 and results in peaking 21 in the supply noise sensitivity transfer function (VS(s)NDD_NOISY(s)) as shown in FIG. 2.

As shown in FIG. 2, there is a gap 20 between F1 and F2 where the overall supply regulation circuit does not reject supply voltage noise well. This poor rejection of voltage supply noise is referred to as supply noise sensitivity "peaking" and is represented by arrow 21. The frequency F1 of the dominant pole is determined by parasitic capacitances of transistor M1 11 such as the source-to-gate parasitic capacitance 22 and the gate-to-drain parasitic capacitance 23 and the output resistance of operational amplifier 10. Making these parasitic capacitances smaller would allow the frequency F1 of the dominant pole to be increased, and these parasitic capacitances could be made smaller by making transistor 11 smaller. Unfortunately, transistor 11 must be large enough to supply the required current signal ICTRL 17 to the oscillator 7. The output resistance of the operational amplifier 11 could be decreased to increase the frequency F1 of the dominant pole as well, but this would increase the supply noise sensitivity at low frequencies. For such reasons, the frequency F1 of the dominant pole cannot generally be increased as much as desired to close the F1 to F2 gap 20. Secondly, the frequency F2 due to the bypass capacitor 6 cannot generally be decreased enough to eliminate the F1 to F2 gap 20. One limit on how low F2 can be is the amount of integrated circuit area required to realize a larger bypass capacitor. Another limit is stability of the supply regulation loop. If the non-dominant pole gets too close in frequency to frequency of the dominant pole of the supply regulation loop, then the stability of the supply regulation loop is degraded.

Figure 3:
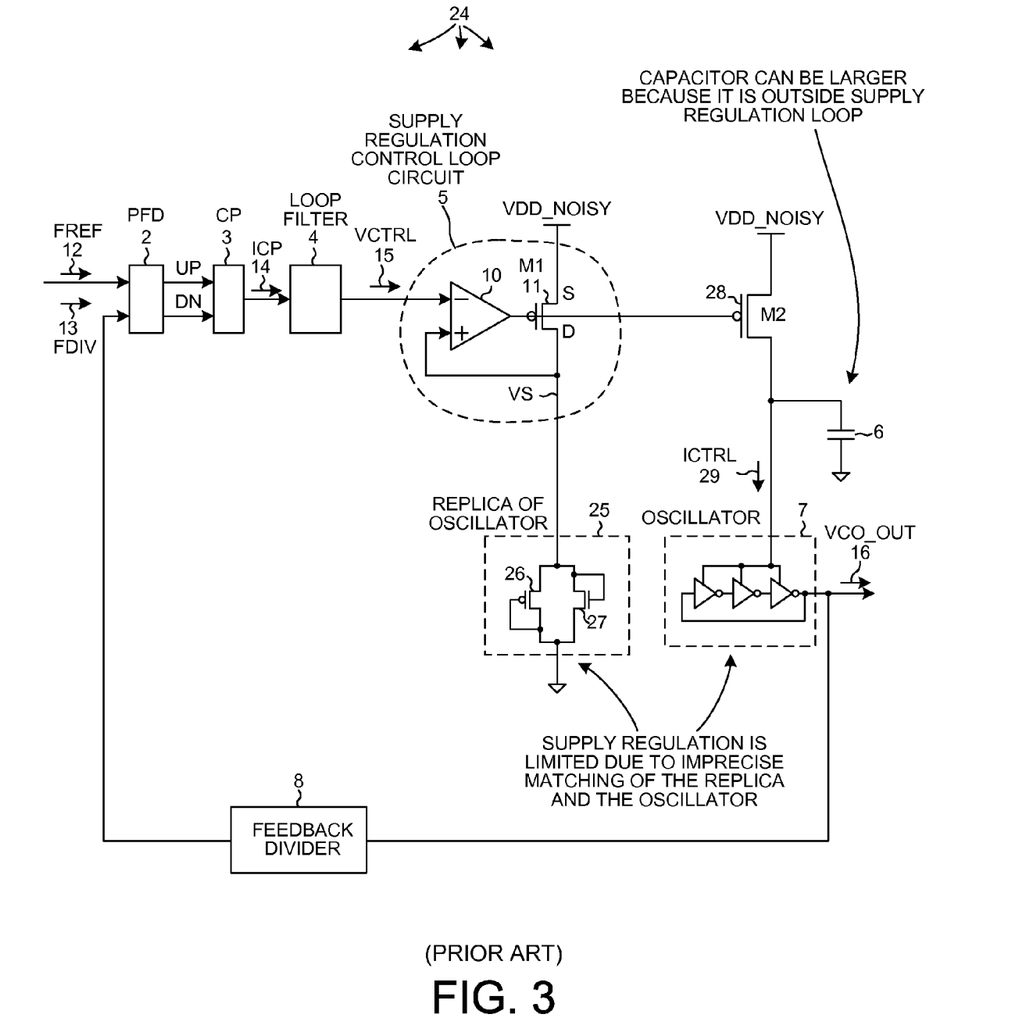
FIG. 3 (Prior Art) is a diagram of a PLL employing a second type of conventional supply-regulated Voltage-Controlled Oscillator (VCO).

FIG. 3 (Prior Art) is a diagram of a PLL circuit 24 that overcomes some of the problems of the circuit of FIG. 1. A replica 25 of the oscillator 7 has a low frequency current-voltage characteristic (I-V characteristic) similar to the I-V characteristic of oscillator 7. Replica 25 in this case involves a diode-connected P-channel transistor 26 that is connected in parallel with a diode-connected N-channel transistor 27. These transistors are sized such that the I-V characteristic of replica 25 is similar to the I-V characteristic of oscillator 7. In circuit 24 of FIG. 3, the gate of transistor M1 11 of the supply regulation control loop circuit 5 is tied to the gate of a second transistor M2 28. Accordingly, the supply regulation control loop circuit 5 can regulate using transistor M1 11, and can at the same time also supply current ICTRL 29 to the main oscillator 7 via a transistor M2 28. The bypass capacitor 6 is no longer in the operational amplifier supply regulation control loop 5. Hence, the size of bypass capacitor 6 can be increased to mitigate supply noise sensitivity peaking without affecting the stability of the supply regulation loop.

Figure 4:
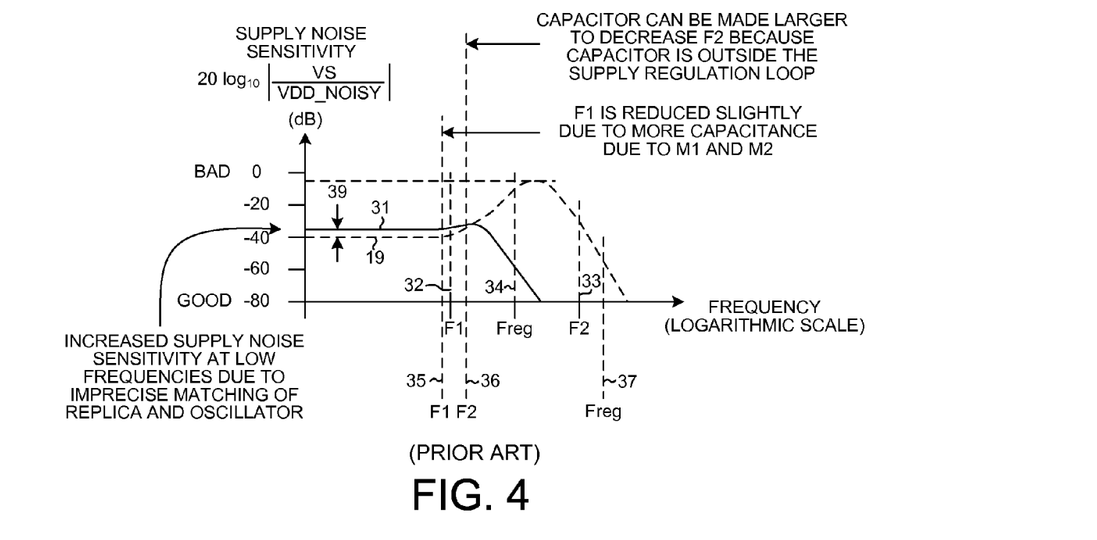
FIG. 4 (Prior Art) is a diagram that shows an operation of the supply-regulated VCO of FIG. 3.

FIG. 4 (Prior Art) is a diagram that illustrates a problem with the circuit of FIG. 3. Dashed line 19 indicates how supply noise sensitivity changes as a function of frequency in the circuit of FIG. 1, whereas solid line 31 indicates how supply noise sensitivity changes as a function of frequency in the circuit of FIG. 3. Vertical dashed lines 32, 33 and 34, indicate F1, F2 and Freg of the circuit of FIG. 1, respectively, whereas vertical dashed lines 35, 36 and 37 indicate F1, F2 and Freg of the replica circuit of FIG. 3, respectively. As compared to the circuit of FIG. 1, the frequency F1 is reduced due to the additional parasitic capacitances associated with transistor M2. As compared to the circuit of FIG. 1, the frequency F2 in the replica circuit can be decreased because the capacitor 6 is outside the supply regulation loop and therefore can be made larger. Because F2 can be made very close to or less than F1, there is little or no supply noise sensitivity peaking. The I-V characteristic of the replica 25 may not, however, exactly match the I-V characteristics of the oscillator 7. This imprecise matching serves to increase supply noise sensitivity at low frequencies as illustrated. Arrows 39 represent the increased supply noise sensitivity at low frequencies that is largely due to imprecise matching of the replica and the oscillator.

Another problem associated with the circuit of FIG. 3 is that the low frequency noise (such as 1/f noise) from the replica transistors themselves 26 and 27 will cause low frequency variations in ICTRL. This can increase the close-in phase noise of the ring oscillator 7 which is an important specification in certain applications. The noise contribution from the replica transistors 26 and 27 will cause a variation in VS. The supply regulation control loop 5 will try to compensate for this variation by applying a corrective voltage to the gates of transistors M1 and M2. However, the corrective voltage applied to gate of transistor M2 will actually cause undesirable low frequency variations in ICTRL. This is because the noise sources in this case are the replica devices themselves unlike the supply noise which is common to both the replica and the oscillator. This is a problem only at frequencies within the bandwidth of the supply regulation control loop 5. At high frequencies, the bypass capacitor 6 will shunt the noise currents to ground.

Figure 5:
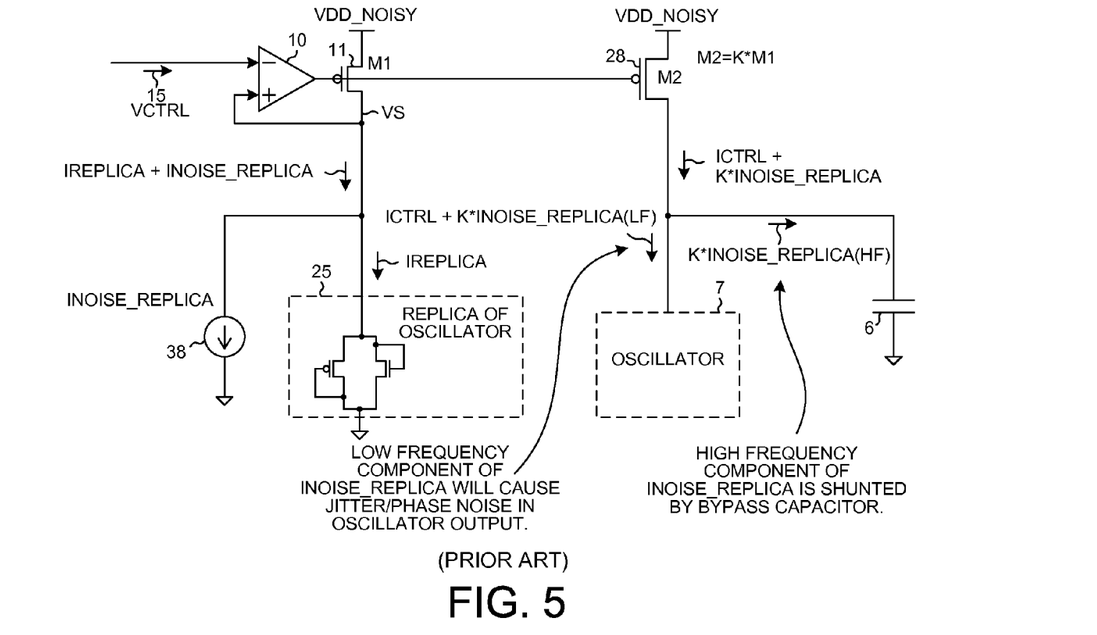
FIG. 5 (Prior Art) is a simplified diagram that illustrates the low frequency noise problem with the circuit of FIG. 3.

FIG. 5 (Prior Art) is a simplified diagram that illustrates the low frequency noise problem with the circuit of FIG. 3. The current source symbol 38 represents the noise current INOISE_REPLICA due to replica 25. This noise current has two components, a low frequency component INOISE_REPLICA(LF) and a high frequency component INOISE_REPLICA(HF). The supply regulation control loop involving operational amplifier 10 supplies the total current IREPLICA+INOISE_REPLICA. ICTRL is the desired control current of magnitude K*IREPLICA as supplied to the oscillator 7, where transistor M2 is K times larger than transistor M1. Because transistor M2 is K times larger than transistor M1, the noise current INOISE_REPLICA is multiplied by transistor M2 such that the current supplied by transistor M2 is ICTRL+K*INOISE_REPLICA. Although bypass capacitor 6 can shunt high frequency noise to ground, it does not shunt low frequency noise to ground. Bypass capacitor 6 shunts the K*INOISE_REPLICA(HF) component of current output by transistor M2 to ground, leaving the remaining K*INOISE_REPLICA(LF) to flow into the oscillator 7. This low frequency component of the magnified replica noise causes jitter and phase noise in the signal output by oscillator 7.

SUMMARY

A supply-regulated VCO exhibits reduced peaking in the supply noise sensitivity transfer function. The supply-regulated VCO includes an oscillator whose supply current is regulated to control the oscillating frequency of the oscillator. A VCO input signal (this signal may be designated VCTRL or VTUNE) controls the supply current supplied to the oscillator so that there is a relationship between the input signal and the oscillating frequency of the oscillator. Power supply noise that might otherwise affect oscillator operation is shunted away from a supply current input lead of the oscillator and to a ground conductor by a bypass capacitor.

In a first novel aspect, an auxiliary supply current circuit supplies an auxiliary supply current IASUP to the oscillator, thereby reducing the amount of supply current ICL a supply regulation control loop circuit must supply to control the oscillator. Because the amount of supply current ICL that the supply regulation control loop circuit must supply is reduced, a transistor in the supply regulation control loop circuit through which the supply current ICL is supplied can be reduced in size. By reducing the size of this transistor, parasitics that give rise to a pole (at frequency F1) in the supply regulation loop are reduced. Reducing parasitics in this transistor increases the frequency F1 of this pole and allows the designer to compensate the supply regulation loop by treating the pole due to the bypass capacitor at F2 as the dominant pole. The capacitance of the bypass capacitor can be increased without adversely affecting loop stability. This serves to reduce peaking in the supply sensitivity transfer function VS(s)VDD_NOISY(s).

In a first embodiment of the first novel aspect, the auxiliary supply current circuit includes a replica load (a replica of the load exhibited by the oscillator) and an auxiliary supply regulation control loop circuit for supplying the replica load with a supply current. The supply regulation control loop circuit for the replica load outputs the auxiliary supply current IASUP. In this case, the auxiliary supply current IASUP is substantially directly proportional to the supply current ICL supplied by the main supply regulation control loop circuit.

In a second embodiment of the first novel aspect, the auxiliary supply current circuit is a digitally-controlled current source. A multi-bit digital control signal supplied to the digitally-controlled current source determines the magnitude of the auxiliary supply current IASUP. The digitally-controlled current source is controlled so that over the frequency operating range of the VCO, the ratio of the auxiliary supply current IASUP to the supply current ICL is substantially constant.

In a second novel aspect, a supply regulation control loop circuit supplies a control current to a master oscillator. The output of the master oscillator is then used to close a PLL control loop. The bypass capacitor of the supply-regulated VCO is not, however, coupled to the supply current input lead of this master oscillator but rather is coupled to a slave oscillator. The output of the slave oscillator is then used to clock the external circuits such as a CPU or an RF synthesizer or another circuit. The slave oscillator is injection-locked to the master oscillator. Because the bypass capacitor is outside the main PLL feedback control loop, the capacitance of the bypass capacitor can be increased without affecting the stability of the main PLL loop. Supply noise sensitivity can now be minimized by increasing the capacitance of the bypass capacitor without affecting overall PLL loop stability. If the bypass capacitor were provided across the master oscillator, then it would introduce a pole in the PLL loop transfer function at frequency=½π(RVCO*CBYCAP) where RVCO is the effective resistance of the master oscillator and CBYCAP is the value of the bypass capacitor. Because the bypass capacitor is outside the main PLL feedback control loop, the capacitance CBYCAP of the bypass capacitor is limited only by integrated circuit area constraints.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 6:
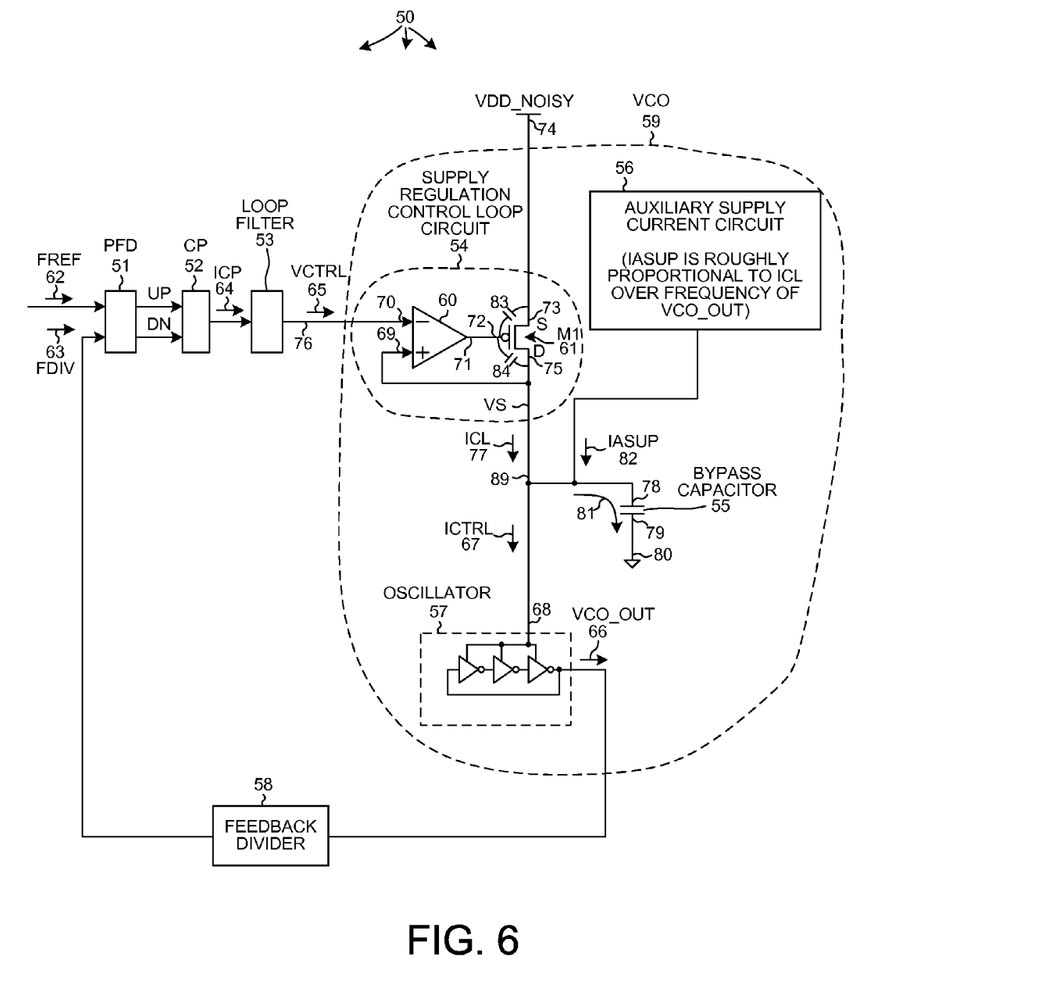
FIG. 6 is a diagram of a PLL employing a supply-regulated VCO in accordance with a first novel aspect.

FIG. 6 is a diagram of a Phase-Locked Loop (PLL) 50 involving a supply-regulated VCO 59 in accordance with a first novel aspect. PLL 50 includes a Phase-to-Frequency Detector (PFD) 51, a Charge Pump (CP) 52, a loop filter 53, a supply regulation control loop circuit 54, a bypass capacitor 55, an auxiliary supply current circuit 56, an oscillator 57, and a feedback divider 58. The supply regulation control loop circuit 54, the oscillator 57, and the bypass capacitor 55 together form the supply-regulated VCO 59.

PFD 51 compares the phase of a reference signal FREF 62 and the phase of a feedback signal FDIV 63 and outputs UP pulses or DN pulses depending on whether the phase of FDIV leads or leads or lags the phase of FREF. Charge pump 52 converts the pulses into a control current signal ICP 64. Control signal ICP 64 is filtered by loop filter 53 and is converted into a control voltage signal VCTRL 65. The VCTRL signal is sometimes referred to as a fine tune signal and is denoted VTUNE. The supply regulation control loop circuit 54, the oscillator 57, the auxiliary supply current circuit 56, and the bypass capacitor 55 together constitute a VCO because the oscillating frequency of the output signal VCO_OUT 66 of the oscillator is a function of the input control voltage signal VCTRL 65. As the PLL operates, the voltage of the control voltage signal VCTRL 65 is adjusted to adjust the phase of signal VCO_OUT 66 such that the phase of signal FDIV 63 as received by PFD 51 matches and is locked to the phase of the reference signal FREF 62 as received by PFD 51.

Oscillator 57 in the illustrated example is a ring oscillator made up of a ring of inverters. Oscillator 57 receives a control current ICTRL 67 via supply current input lead 68. The diagram of oscillator 57 is a simplified diagram. The control current ICTRL 67 may be supplied to only a part of the oscillator rather than to all the inverters of the ring as illustrated. The oscillator output signal VCO_OUT 66 has a frequency that is fairly directly proportional to the magnitude of the supply current ICTRL 67 supplied to the oscillator. If signal VCTRL 65 increases, then the control current ICTRL 67 supplied to the oscillator 57 also increases, and this increase in current ICTRL 67 causes the oscillating frequency of the oscillator output signal VCO_OUT 66 to increase. Similarly, if signal VCTRL 65 decreases, then the control current ICTRL 67 supplied to the oscillator 57 decreases, and this causes the oscillating frequency of the oscillator output signal VCO_OUT 66 to decrease.

Supply regulation control loop circuit 54 includes an operational amplifier 60 and a P-channel field effect transistor M1 61 interconnected as illustrated. The operational amplifier 60 of supply regulation control loop circuit 54 has a noninverting input lead 69, an inverting input lead 70, and an output lead 71. The output lead 71 is coupled to the gate 72 of transistor 61. The source 73 of transistor 61 is coupled to supply voltage conductor 74. A DC supply voltage VDD_NOISY is present on supply voltage conductor 74. The drain 75 of transistor 61 is coupled to the noninverting input lead 69 of operational amplifier 60 and is also coupled to the supply current input lead 68 of oscillator 57. The control voltage signal VCTRL 65 is received onto the inverting input lead 70 of operational amplifier 60 from loop filter 53 via control signal input conductor 76. The supply regulation control loop circuit 54 outputs a first supply current ICL 77 from the drain 75 of transistor 61.

Bypass capacitor 55 has a first lead 78 that is coupled to the supply current input lead 68 of oscillator 57 and to the drain 75 of transistor 61. Bypass capacitor 55 has a second lead 79 that is coupled to a ground conductor 80. Bypass capacitor 55 is coupled so that it can conduct high frequency noise current 81 to ground conductor 80.

Auxiliary supply current circuit 56 is a circuit that outputs a second supply current referred to here as auxiliary supply current IASUP 82. Supply current IASUP 82 combines with the first supply current ICL 77 to form the supply control current ICTRL 67 that is in turn supplied via the supply current input lead 68 to oscillator 57. A noise component of the combined ICL and IASUP currents may be conducted to ground conductor 80 by bypass capacitor 55 so that this noise component does not affect oscillator 57. As is explained in further detail below, the current IASUP 82 is substantially proportional to the current ICL 77 over the frequency range of operation of VCO 59. For example, if current ICL 77 were to increase due to an increase in the frequency of operation of VCO 59, then the current IASUP 82 would also increase so that the ratio of current ICL 77 to current IASUP 82 would remain substantially constant despite the increase in the frequency of operation of VCO 59. Similarly, if the current ICL 77 were to decrease due to a decrease in the frequency of operation of VCO 59, then the current IASUP 82 would also decrease so that the ratio of current ICL 77 to current IASUP 82 would remain substantially constant despite the decrease in operating frequency of VCO 59.

Because all of the supply current ICTRL 67 supplied to the oscillator 57 need not be supplied in the form of current ICL 77 from the supply regulation control loop circuit 54, the size of transistor 61 can be made smaller than if auxiliary supply current IASUP 82 were not provided. Reducing the size of transistor 61 serves to reduce parasitics of transistor 61 including the gate-to-source capacitance 83 and the gate-to-drain capacitance 84. In one embodiment, the majority of the VCO control current ICTRL 67 is supplied by the auxiliary supply current circuit 56. Due to this reducing of the parasitics of transistor 61, the frequency F1 of the pole due to the parasitic capacitance associated with transistor M1 61 and the output resistance of operational amplifier 60 is increased as compared to the frequency F1 in the conventional circuit of FIG. 1 (Prior Art). The pole at F2 due to bypass capacitor 55 will now be the dominant pole in the supply regulation loop. This allows the designer to increase the size of the bypass capacitor 55, thereby reducing peaking in the supply noise transfer function while simultaneously stabilizing the supply regulation loop.

In one example, bypass capacitor 55 is a 20 pF capacitor and is of adequate size to shunt enough noise to ground so that VCO and PLL performance requirements are met. Second supply current IASUP 82 is four times as large as first supply current ICL 77, plus or minus twenty percent, over the entire 0.5 GHz to 1.0 GHz frequency operating range of the VCO.

Figure 7:
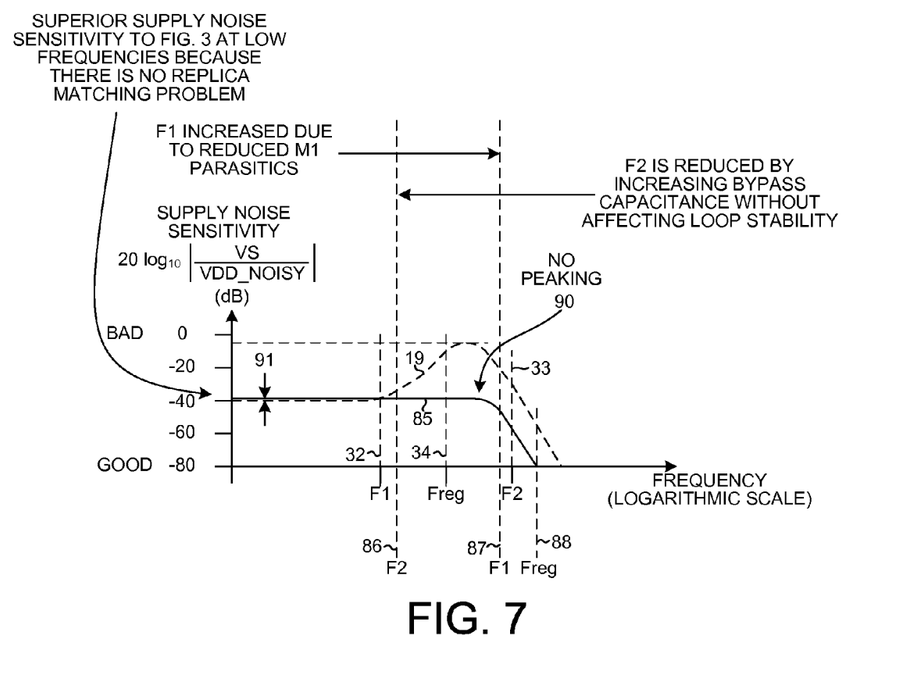
FIG. 7 is a diagram that shows an operation of the supply-regulated VCO of FIG. 6.

FIG. 7 is a diagram that shows the supply noise sensitivity of the circuit of FIG. 6. Voltage VS is the voltage on the common node 89 at the supply current input lead 68 of oscillator 57. Voltage VDD_NOISY is the supply voltage on supply voltage conductor 74. Dashed line 19 indicates how supply noise sensitivity changes as a function of frequency in the conventional circuit of FIG. 1, whereas solid line 85 indicates how supply noise sensitivity changes as a function of frequency in the circuit of FIG. 6. Vertical dashed lines 32, 33 and 34, indicate F1, F2 and Freg of the circuit of FIG. 1, respectively, whereas vertical dashed lines 86, 87 and 88 indicate F1, F2 and Freg of the circuit of FIG. 6, respectively. F2 is the frequency of the pole due to bypass capacitor 55. Above frequency F2, the bypass capacitor works relatively well in shunting supply voltage noise to ground. The frequency F2 is decreased as compared to the conventional circuit of FIG. 1 (Prior Art) because the size of bypass capacitor 55 is increased as compared to the size of the bypass capacitor in the conventional circuit. This can be done without adversely affecting the supply regulation loop stability because the pole at frequency F1 due to the supply regulation control loop circuit 54 is moved up in frequency and is now a non-dominant pole. The frequency of F1 is increased as compared to the frequency F1 in the conventional circuit of FIG. 1 (Prior Art) and in the conventional circuit of FIG. 3 (Prior Art) because the loading on the operational amplifier 60 due to the transistors it must drive is reduced in the circuit of FIG. 6 as compared to loading on the corresponding operational amplifiers in the prior art circuits of FIG. 1 and FIG. 3. Where the prior art circuit of FIG. 3 involves two transistors M1 and M2 and their associated combined parasitic capacitances that load the output of the operational amplifier of the supply regulation loop of FIG. 3, in the circuit of FIG. 6 the operational amplifier 60 need only drive one transistor M1 61. Moreover, the size of this transistor 61 can be decreased as compared to the size of transistor M1 11 in the circuit of FIG. 1 and the size of the transistor M2 in FIG. 3. Frequency F1 87 is therefore shown in FIG. 7 to be higher in frequency than the frequency F1 35 in the diagram of FIG. 4. Because frequency F2 is lower than frequency F1, and because the separation in frequency between the two poles at F2 and F1 is substantial, there is little or no supply noise sensitivity "peaking" as indicated by arrow 90. Because the replica matching problem associated with the conventional circuit of FIG. 3 is not present, the circuit of FIG. 6 has better low frequency supply noise rejection compared to the FIG. 3 circuit. In the circuit of FIG. 6, the main supply regulation loop adjusts first support current ICL 77 to compensate for any low frequency variations in auxiliary current IASUP 82 that are caused by noise contributors in the auxiliary circuit 56. Any high frequency variations in auxiliary current IASUP are shunted to ground by bypass capacitor 55.

Figure 8:
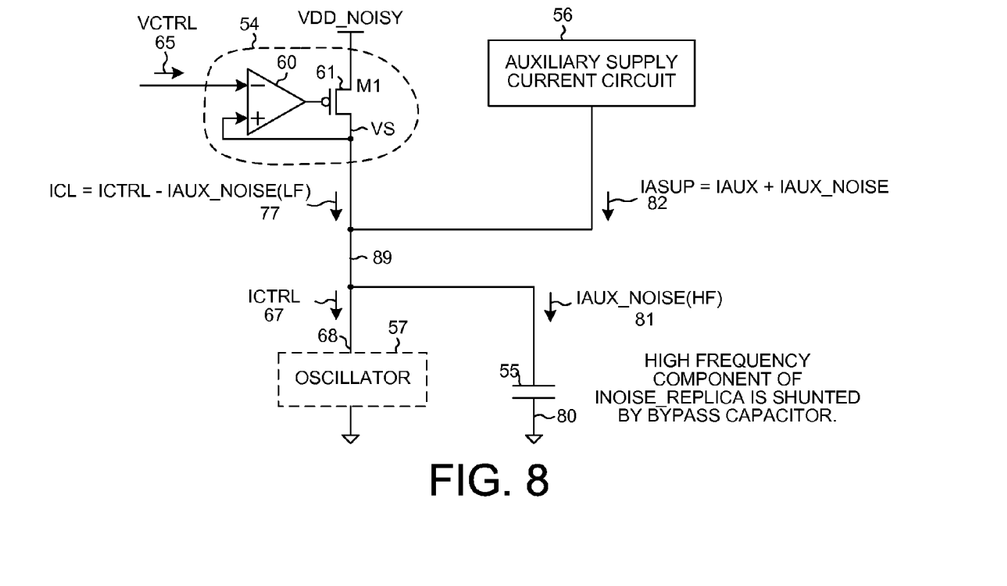
FIG. 8 is a diagram that shows why the circuit of FIG. 6 does not suffer from the low frequency noise problem associated with the circuit of FIG. 3.

FIG. 8 is a simplified diagram that shows why the PLL circuit 50 of FIG. 6 does not suffer from low frequency noise problem associated with the prior art PLL 24 of FIG. 3. Noise introduced by the auxiliary supply current circuit 56 which may contain a replica of the oscillator 57 is denoted IAUX_NOISE. This noise current has a low frequency component IAUX_NOISE(LF) and a high frequency component IAUX_NOISE(HF). The desired auxiliary output current IAUX and this noise current IAUX_NOISE is output by the auxiliary supply current circuit 56 onto VS node 89. Bypass capacitor 55 shunts the high frequency component IAUX_NOISE(HF) to ground conductor 80. The supply regulation control loop 54 regulates the voltage on node 89 well at low frequencies, and consequently the low frequency noise component IAUX_NOISE(LF) from the auxiliary supply current circuit 56 is compensated for by the supply regulation control loop 54. Any mismatch between the oscillator 57 and any replica which may be part of the auxiliary circuit 56 can be modeled as a DC or low frequency disturbance in current IAUX_NOISE. This DC or low frequency disturbance will be compensated for by the supply regulation control loop 54. Current ICTRL 67, substantially free of auxiliary supply current noise, is therefore supplied via supply current input lead 68 to oscillator 57. Supply current input lead 68 is actually a part of node 89. Currents ICL 77 and IASUP 82 flow into this node, and currents ICTRL 67 and IAUX_NOISE(HF) 81 flow out of this node.

Figure 9:
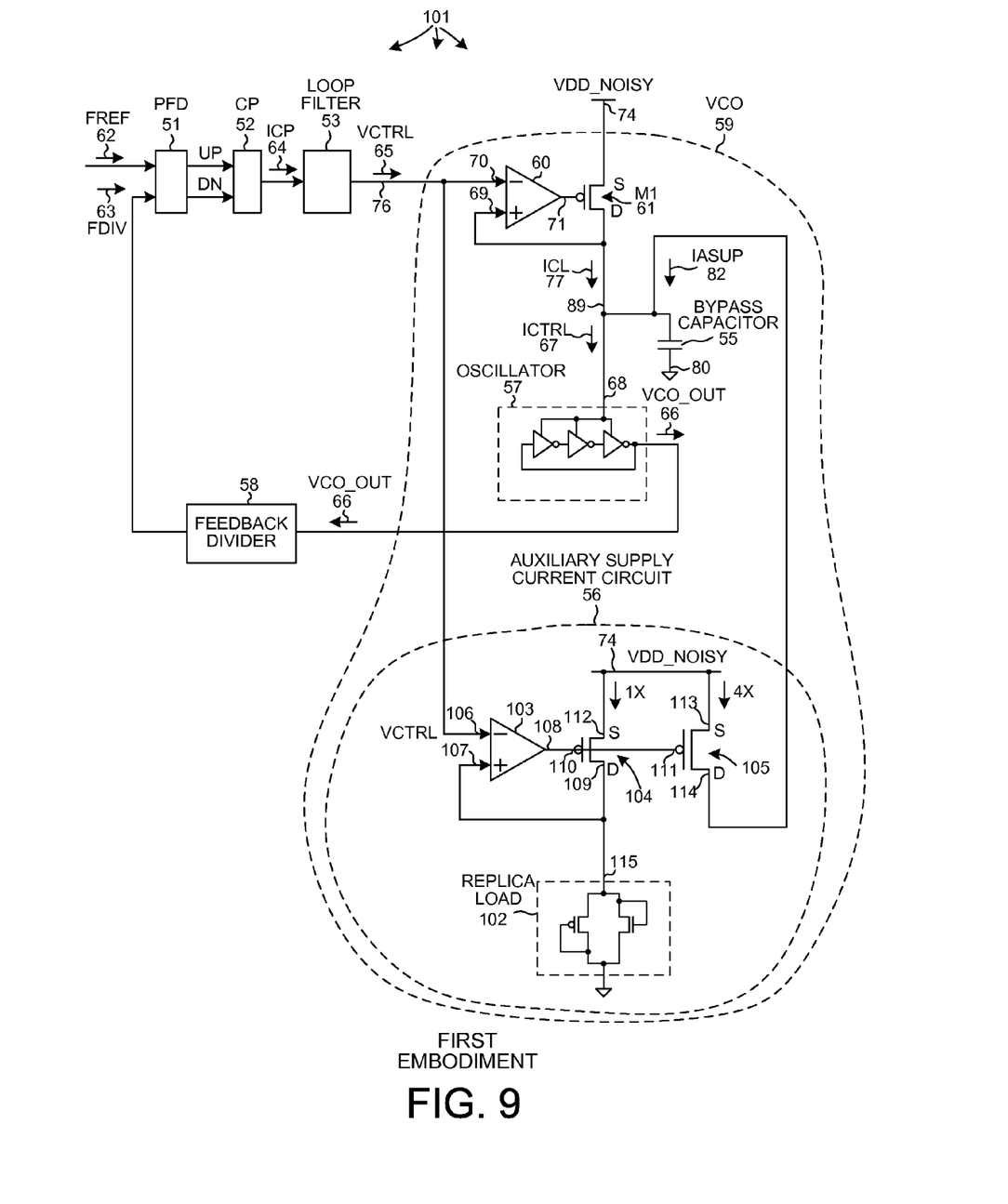
FIG. 9 is a diagram of a first embodiment of the PLL of FIG. 6 in accordance with the first novel aspect.

FIG. 9 is a circuit diagram of a first embodiment 101 of the generalized PLL circuit 50 of FIG. 6. In the case of first embodiment 101, the auxiliary supply current circuit 56 includes a replica load 102, an operational amplifier 103, a first P-channel transistor 104, and a second P-channel transistor 105. Replica load 102 has a current-voltage characteristic (I-V characteristic) that substantially replicates the I-V characteristic of oscillator 57. First transistor 104 is one fourth the size of second transistor 105. The inverting input lead 106 of operational amplifier 103 is coupled to receive the control signal VCTRL. The noninverting input lead 107 of operational amplifier 103 is coupled to the drain 109 of first transistor 104. The output lead 108 of operational amplifier 103 is coupled to the gate 110 of the first transistor 104 and to the gate 111 of the second transistor 105. The source 112 of transistor 104 and the source 113 of transistor 105 are coupled to supply voltage conductor 74. This supply voltage conductor 74 is the same supply voltage conductor 74 that supplies the supply current to the main supply regulation control loop 54. The drain 114 of second transistor 105 outputs the auxiliary supply current IASUP 82. Replica load 102 receives a current via supply input lead 115.

In one example, replica load 102 involves a diode-connected P-channel transistor that is connected in parallel with a diode-connected N-channel transistor as shown. These two transistors are sized such that the I-V characteristic across these parallel-connected transistors approximates the I-V characteristic of oscillator 57. In another example, replica load 102 is actually a scaled version of the oscillator 57 being replicated. Alternatively, other ways of making a suitable replica load can be employed to realize replica load 102.

Figure 10:
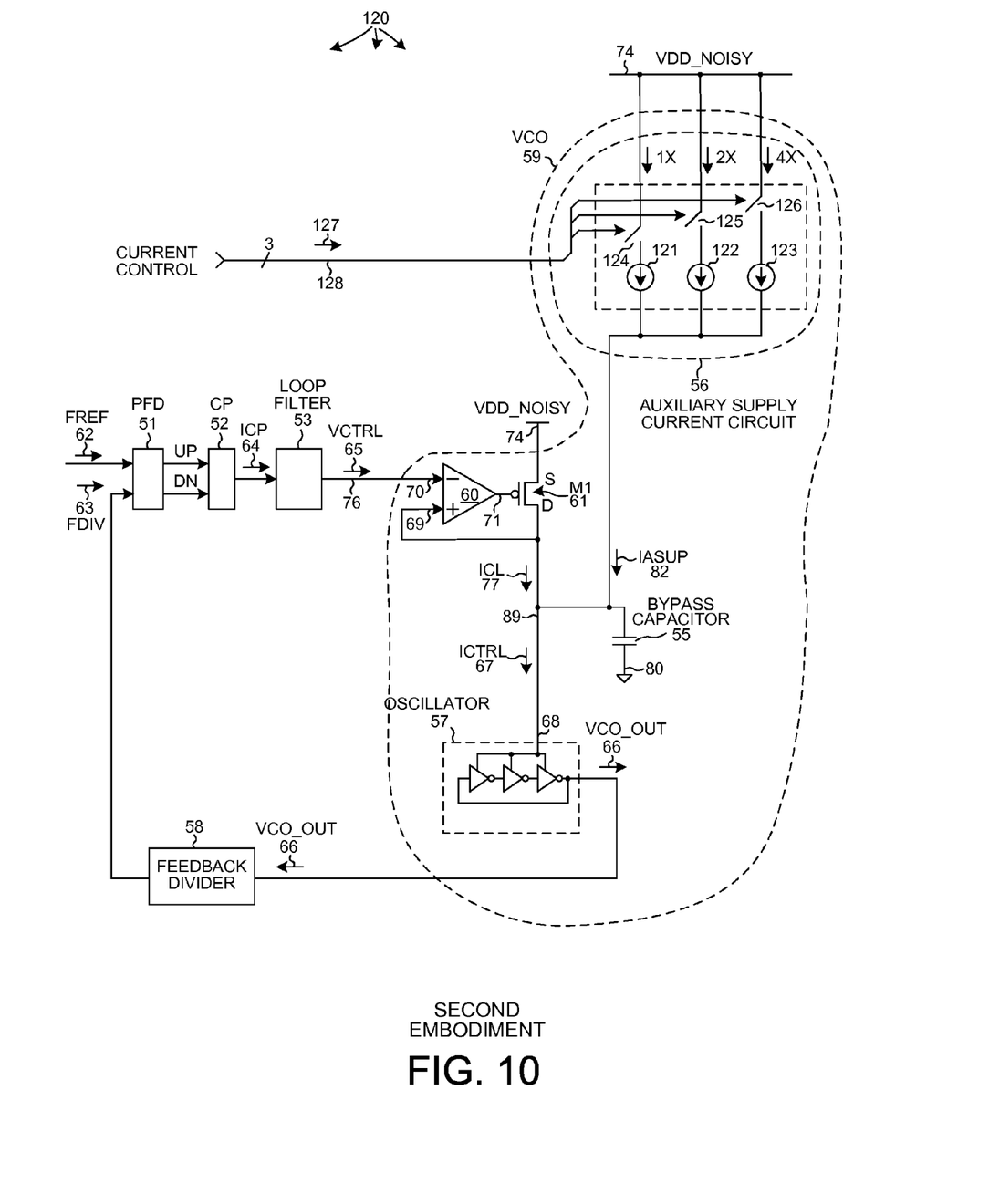
FIG. 10 is a diagram of a second embodiment of the PLL of FIG. 6 in accordance with the first novel aspect.

FIG. 10 a circuit diagram of a second embodiment 120 of the generalized PLL circuit 50 of FIG. 6. In the case of second embodiment 120, the auxiliary supply current circuit 56 includes a digitally-controlled current source. The digitally-controlled current source in the illustrated example includes three binary-weighted current sources 121-123 and three corresponding switches 124-126. The amount of current output by the digitally-controlled current source is the auxiliary supply current IASUP 82. The magnitude of current ISSUP 82 is determined by the three-bit digital value of the multi-bit digital signal 127 received onto the auxiliary supply current circuit via conductors 128. In one example, the VCO 59 is within a PLL within a local oscillator of an RF receiver and the multi-bit digital signal 127 is supplied by digital baseband processor circuit that tunes the receiver to downconvert as appropriate. The VCO 59 may, for example, be disposed on an RF transceiver integrated circuit. The digital baseband processor circuit is a part of a digital baseband processor integrated circuit. The digital baseband processor circuit sends tuning information across a serial bus from the digital baseband processor integrated circuit to the RF transceiver integrated circuit, and this tuning information includes the multi-bit digital signal 127 that sets the magnitude of IASUP 82. The digitally-controlled current source is controlled such that the ratio of current ICL 77 to current IASUP 82 remains substantially constant over the operating frequency range of VCO 59. Because the auxiliary supply current circuit 56 supplies some of the current ICTRL 67 required by the oscillator 57, the size of transistor 61 can be reduced and the capacitance of bypass capacitor 55 can be increased as compared to the conventional VCO of FIG. 1. Transistor M1 61 and the digitally-controlled current source of the auxiliary supply current circuit 56 are sized such that the source resistance RDAC of the digitally-controlled current source (the resistance through the digitally-controlled current source from VDD conductor 74 to the output lead of the digitally-controlled current source) is much greater than the source resistance ROUTM1 of transistor M1 (the resistance through transistor M1 from VDD conductor 74 to the drain of transistor M1).

Figure 11:
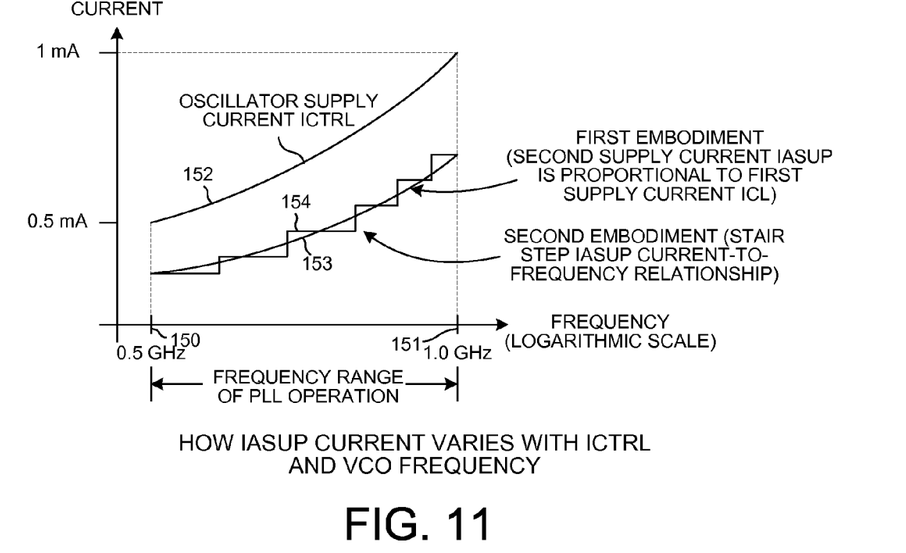
FIG. 11 is a diagram that shows how the auxiliary supply current IASUP varies with respect to the total supply current ICTRL in the first embodiment of FIG. 9 and in the second embodiment of FIG. 10.

FIG. 11 is a diagram that shows how the auxiliary supply current IASUP 82 varies with respect to the total supply current ICTRL 67 supplied to oscillator 57. The operational frequency range of the VCO 59 extends from a lower bound frequency 150 of 0.5 GHz to an upper bound frequency 151 of 1 GHz. Line 152 represents the supply current ICTRL 67 supplied to oscillator 57. Smooth line 153 represents the auxiliary supply current IASUP 82 in the case of the first embodiment of FIG. 9. Stairs step line 153 represents the auxiliary supply current IASUP 82 in the case of the second embodiment of FIG. 10.

Figure 12:
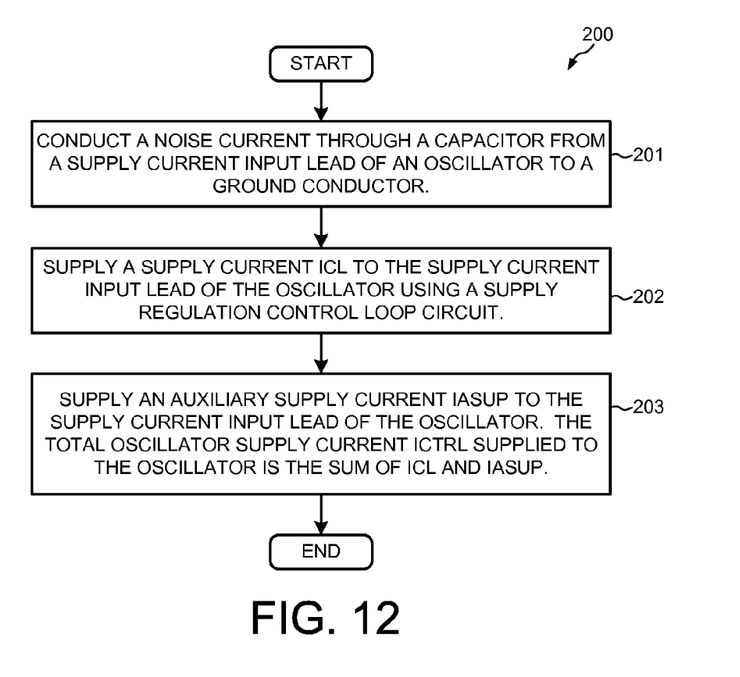
FIG. 12 is a flowchart of a method 200 in accordance with the first novel aspect of FIG. 6.

FIG. 12 is a flowchart of method 200 in accordance with the first novel aspect of FIG. 6. A noise current is conducted (step 201) through a capacitor from a supply current input lead of an oscillator to a ground conductor. In one example, the noise current is high frequency noise current 81 and the capacitor is bypass capacitor 55. This bypass capacitor 55 conducts the high frequency noise current 81 from the supply current input lead 68 (node 89) of oscillator 57 to the ground conductor 80. A supply regulation control loop circuit supplies a supply current ICL (step 202) to the supply current input lead of the oscillator. In one example, the supply regulation control loop circuit is circuit 54 and this circuit 54 supplies current ICL 77 onto node 89 and the supply current input lead 68 of oscillator 57. An auxiliary supply current IASUP is also supplied (step 203) to the supply current input lead of the oscillator. In one example, the auxiliary supply current circuit 56 supplies the IASUP current 82 onto node 89 at the supply current input lead 68 of oscillator 57. In the event there is low frequency noise supply voltage conductor 74, this noise is rejected by the supply regulation control loop circuit 54. In the event high frequency noise passes through supply regulation control loop circuit 54 most or all of this high frequency noise is conducted by capacitor 55 from supply current input lead 68 (node 89) to ground conductor 80 in the form of noise current 81. The drain of transistor 61, one plate of bypass capacitor 55, and the supply current input lead 68 actually together form one common summing node 89. Currents 77 and 82 flow into this node and currents 67 and 81 flow out of this node.

Figure 13:
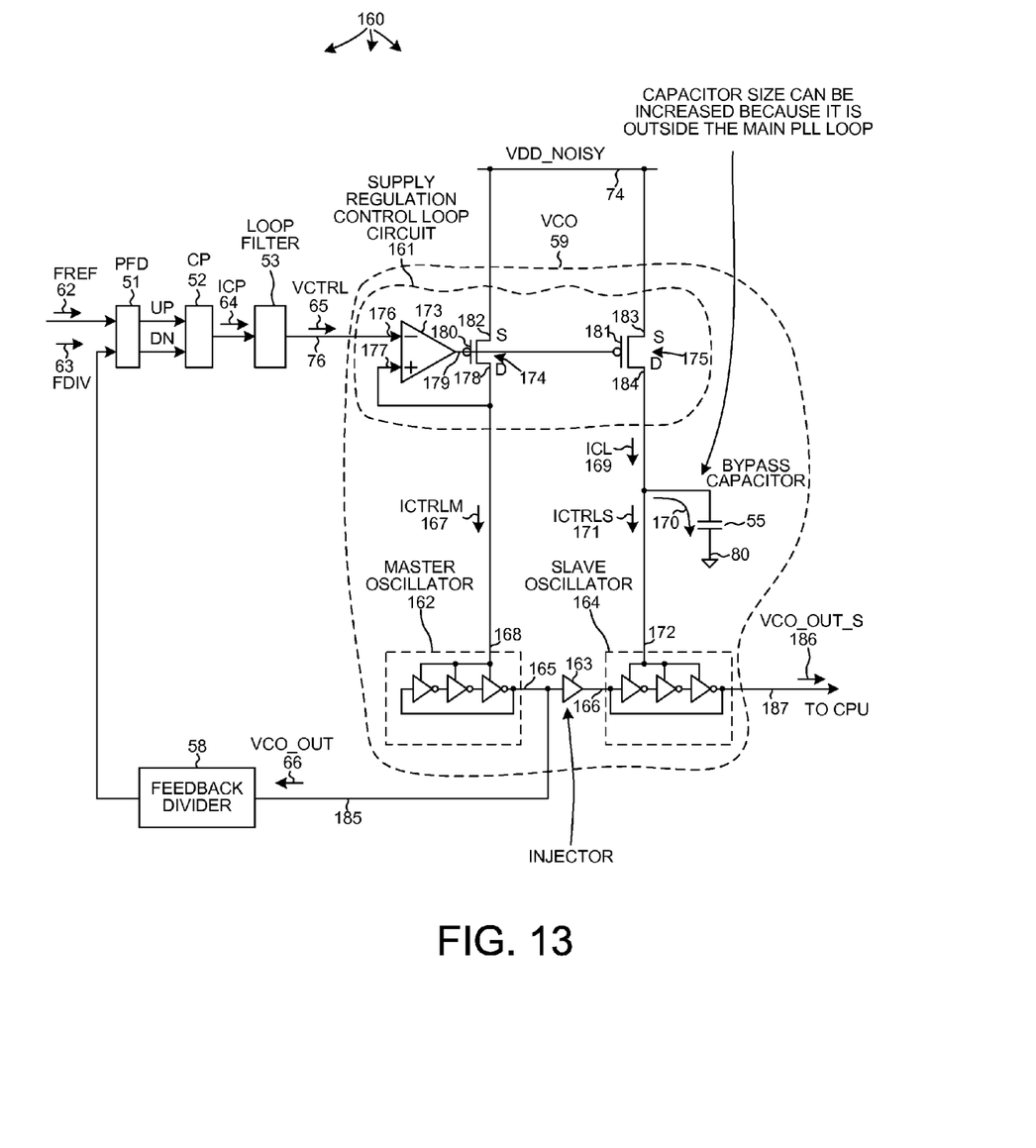
FIG. 13 is a diagram of a PLL where a VCO of the PLL involves a slave oscillator that is injection-locked to a master oscillator in accordance with a second novel aspect.

FIG. 13 is a diagram of a PLL 160 involving a supply-regulated VCO in accordance with a second novel aspect. PFD 51, CP 52, loop filter 53, and feedback divider 58 are the same and have the same functions as in the first and second embodiments described above. The supply-regulated VCO 59 of the PLL includes a supply regulation control loop circuit 161, bypass capacitor 55, a master oscillator 162, an injector 163, and a slave oscillator 164. The output signal VCO_OUT 66 on output lead 165 of master oscillator 162 is supplied via injector 163 to the input lead 166 of slave oscillator 164 such that the slave oscillator 164 is injection-locked to the master oscillator 162. The supply regulation control loop circuit 161 supplies a first supply current ICTRLM 167 to the supply current input lead 168 of master oscillator 162. The supply regulation control loop circuit 161 also outputs a second supply current ICL 169. Bypass capacitor 55 conducts a high frequency noise component 170 of supply current ICL 169 to ground conductor 80. The remaining amount of supply current ICTRLS 171 is supplied to the supply current input lead 172 of slave oscillator 164.

Supply regulation control loop circuit 161 includes an operational amplifier 173, a first P-channel transistor 174, and a second P-channel transistor 175. An inverting input lead 176 of operational amplifier 173 receives the control signal VCTRL 65 via control signal input conductor 76 from loop filter 53. A noninverting input lead 177 of operational amplifier 173 is coupled to the drain 178 of first P-channel transistor 174. An output lead 179 of operational amplifier 173 is coupled to the gate 180 of the first transistor 174 and to the gate 181 of the second transistor 175. The source 182 of first transistor 174 is coupled to supply voltage conductor 74 and the source 183 of second transistor 175 is also coupled to supply voltage conductor 74. The control current ICTRLM 167 is supplied from drain 178 of the first transistor 174. The control current ICL 169 is supplied from the drain 184 of the second transistor 175.

In operation, a first part of the supply regulation control loop circuit 161 involving operational amplifier 173 and first transistor 174 supplies regulated current ICTRLM 167 to the supply current input lead 168 of master oscillator 162. The output signal VCO_OUT 66 from the master oscillator 162 is used to close the PLL control loop by supplying the VCO_OUT signal to the feedback divider 58 via conductor 185. Feedback divider 58 divides the signal VCO_OUT down and supplies the resulting signal FDIV 63 to FPD 51. The supply regulation control loop circuit 161 adjusts ICTRLM current 167 such that the phase of feedback signal FDIV is in phase with and locked to the reference signal FREF 62 at the inputs of PDF 51. The signal VCO_OUT_S 186 output by slave oscillator 164, on the other hand, is a clock signal supplied via conductor 187 to a CPU or to a RF synthesizer or to another circuit. The signal VCO_OUT_S 186 is not used for feedback purposes. Because the slave oscillator 164 is injection-locked to the master oscillator 162, its output frequency is an integer multiple or sub-multiple of the oscillating frequency of master oscillator 162. Because bypass capacitor 55 is outside the main PLL loop, the capacitance of bypass capacitor 55 can be increased without affecting the stability of the main PLL loop. Power supply noise sensitivity can be minimized by increasing the capacitance of bypass capacitor 55 without affecting overall PLL loop stability which is not possible in the prior art architecture of FIG. 1. The capacitance of bypass capacitor 55 is limited only by integrated circuit area constraints.

Figure 14:
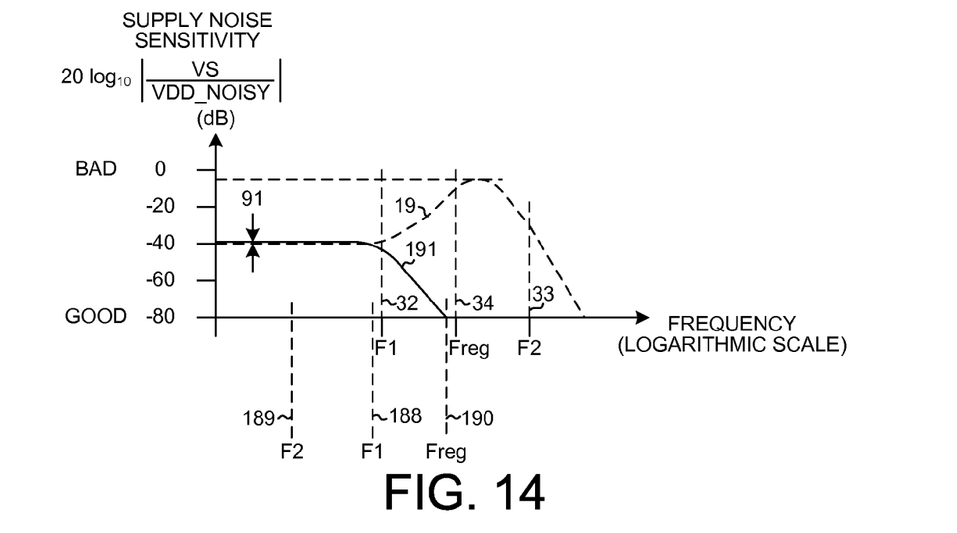
FIG. 14 is a diagram that shows an operation of the supply-regulated VCO of FIG. 13.

FIG. 14 is a diagram that shows how the supply noise sensitivity of the supply regulation control loop circuit 161 rejects noise present on supply conductor 74 in the supplying of the supply current ICTRLS 171 to the supply current input lead 172 of slave oscillator 164. Dashed line 19 indicates how supply noise sensitivity changes as a function of frequency in the conventional circuit of FIG. 1, whereas solid line 191 indicates how supply noise rejection changes as a function of frequency in the circuit of FIG. 13. Vertical dashed lines 32, 33 and 34, indicate F1, F2 and Freg of the conventional circuit of FIG. 1, respectively, whereas vertical dashed lines 188, 189 and 190 indicate F1, F2 and Freg of the circuit of FIG. 5, respectively. As compared to the circuit of FIG. 1, the frequency F1 is reduced due to the additional parasitic capacitances associated with transistor 174. However, the size of bypass capacitor 55 can be substantially increased as compared to the prior art architectures of FIG. 1 and FIG. 3. This can be done without adversely affecting the stability of the main PLL loop because bypass capacitor 55 is connected across slave oscillator 164 and the output of the master oscillator is used to close the main PLL loop. Hence F2 is made substantially less than F1. F2 being substantially less than F1 results in the complete elimination of peaking in the supply noise sensitivity function and results in good supply noise rejection over a wide range of frequencies as shown in FIG. 14.

Figure 15:
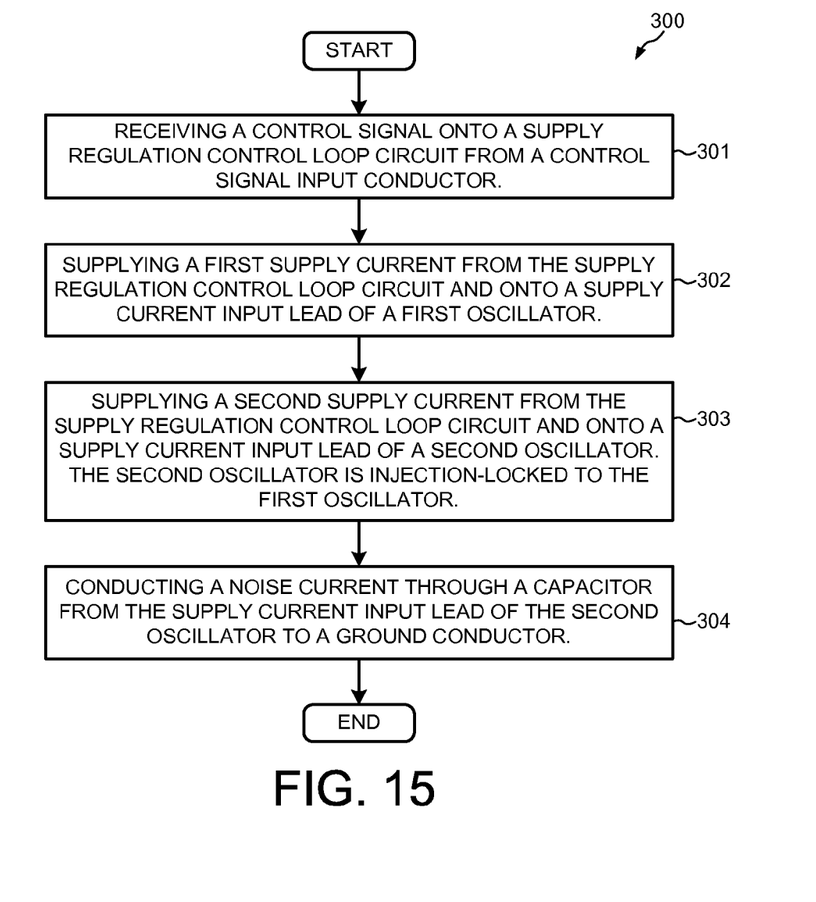
FIG. 15 is a flowchart of a method 300 in accordance with the second novel aspect of FIG. 13.

FIG. 15 is a flowchart of a method 300 of operating a VCO in accordance with the second novel aspect of FIG. 13. A control signal is received (step 301) onto a supply regulation control loop circuit from a control signal input conductor. In one example, the control signal is signal VCTRL 65 in FIG. 13, the supply regulation control loop circuit is circuit 161 in FIG. 13, and the control signal input conductor is conductor 76 in FIG. 13. A first supply current is supplied (step 302) from the supply regulation control loop circuit and onto a supply current input lead of a first oscillator. In one example, the first supply current is current ICTRLM 167 in FIG. 13 and the first oscillator is oscillator 162 in FIG. 13. A second supply current is supplied (step 303) from the supply regulation control loop circuit and onto a supply current input lead of a second oscillator. The second oscillator is injection-locked to the first oscillator. In one example, the second supply current is current ICL 169 in FIG. 13 and the second oscillator is oscillator 164 in FIG. 13. A noise current is conducted (step 304) via a capacitor from the supply current input lead of the second oscillator to a ground conductor. In one example, this noise current is noise current 170 in FIG. 13 and the capacitor is bypass capacitor 55 in FIG. 13. The control signal input conductor, the supply regulation control loop circuit, the first oscillator, the second oscillator, and the bypass capacitor are parts of the VCO. In this discussion, the entire conductor or set of conductors from the drain of transistor 175 to and including the supply current input lead 172 of slave oscillator 164, to and including one plate of bypass capacitor 55 is a single electrical node. Current ICL 169 flows into this common summing node, and currents ICTRLS 171 and noise current 170 flow out of this common summing node.

Although certain specific embodiments are described above for instructional purposes, the teachings of this patent document have general applicability and are not limited to the specific embodiments described above. Although the examples of supply regulation control loops described above involve P-channel transistors where the supply current is sourced from the drains of the P-channel transistors, other current control circuit elements can be used such as N-channel transistors. In such an example where the supply current is supplied from an N-channel transistor, the connections to the inverting and noninverting input leads to the driving operational amplifier are reversed as compared to the connections in the embodiments described above where the operational amplifier drives a current-sourcing N-channel transistor. Accordingly, various modifications, adaptations, and combinations of the various features of the described specific embodiments can be practiced without departing from the scope of the claims that are set forth below.

What is claimed is:

1. A Voltage-Controlled Oscillator (VCO) comprising:
a control signal input conductor;
an oscillator having a supply current input lead;
a bypass capacitor having a first lead coupled to the supply current input lead of the oscillator;
a supply regulation control loop circuit configured to receive a control signal from the control signal input conductor and configured to supply a first supply current to the supply current input lead of the oscillator; and
an auxiliary supply current circuit configured to supply a second supply current to the supply current input lead of the oscillator, wherein the auxiliary supply current includes a replica load that has a current-voltage characteristic (I-V characteristic) that approximates an I-V characteristic of the oscillator.

2. The VCO of claim 1, wherein the first supply current is substantially directly proportional to the second supply current.

3. The VCO of claim 1, wherein the auxiliary supply current circuit further comprises:
an operational amplifier having a first input lead coupled to receive the control signal from the control signal input conductor and having a second input lead coupled to a supply current input lead of the replica load; and
a transistor, wherein a gate of the transistor is coupled to an output lead of the operational amplifier, and wherein a drain of the transistor is coupled to the supply current input lead of the replica load.

4. The VCO of claim 3, wherein the auxiliary supply current circuit further comprises:
a second transistor having a gate and a drain, wherein the gate of the second transistor is coupled to the output lead of the operational amplifier, and wherein the drain of the second transistor is coupled to the supply current input lead of the oscillator.

5. The VCO of claim 1, wherein the supply regulation control loop circuit comprises:
an operational amplifier having a first input lead coupled to receive the control signal from the control signal input conductor and having a second input lead coupled to the supply current input lead of the oscillator; and
a transistor, wherein a gate of the transistor is coupled to an output lead of the operational amplifier, and wherein a drain of the transistor is coupled to the supply current input lead of the oscillator.

6. The VCO of claim 5, wherein the second supply current supplied by the auxiliary supply current circuit is substantially larger than the first supply current supplied by the supply regulation control loop circuit.

7. The VCO of claim 1, wherein the supply regulation control loop circuit supplies the first supply current to the supply current input lead of the oscillator through a first transistor, wherein a drain of the first transistor is coupled to the supply current input lead of the oscillator, wherein the auxiliary supply current circuit supplies the second supply current to the supply current input lead of the oscillator through a second transistor, wherein a drain of the second transistor is coupled to the supply current input lead of the oscillator, and wherein the first transistor is smaller than the second transistor.

8. The VCO of claim 1, wherein the control signal is received via the control signal input conductor from a loop filter.

9. The VCO of claim 1, wherein the supply regulation control loop circuit comprises:
an operational amplifier; and
a current control circuit element configured to receive a control signal from an output lead of the operational amplifier and configured to supply the first supply current to the supply current input lead of the oscillator.

10. A method of operating a Voltage-Controlled Oscillator (VCO) comprising:
conducting a noise current through a capacitor from a supply current input lead of an oscillator to a ground conductor;
supplying a first supply current from a supply regulation control loop circuit onto the supply current input lead of the oscillator, wherein the supply regulation control loop circuit includes an operational amplifier and a transistor, wherein an output lead of the operational amplifier is coupled to a gate of the transistor, and wherein a drain of the transistor is coupled to the supply current input lead of the oscillator; and
supplying a second supply current from an auxiliary supply current circuit onto the supply current input lead of the oscillator, wherein the capacitor, the supply regulation control loop circuit, the oscillator, and the auxiliary supply current circuit are parts of the VCO, wherein the auxiliary supply current circuit includes a replica load that has a current-voltage characteristic (I-V characteristic) that approximates an I-V characteristic of the oscillator.

11. The method of operating the VCO of claim 10, wherein the auxiliary supply current circuit further comprises:
an operational amplifier having a first input lead coupled to receive a control signal from a control signal input conductor and having a second input lead coupled to a supply current input lead of the replica load; and
a transistor, wherein a gate of the transistor of the auxiliary supply current circuit is coupled to an output lead of the operational amplifier of the auxiliary supply current circuit, and wherein a drain of the transistor of the auxiliary supply current circuit is coupled to the supply current input lead of the replica load.

12. The method of operating the VCO of claim 10, wherein the second supply current is substantially directly proportional to the first supply current.

13. The method of operating the VCO of claim 10, wherein the second supply current is substantially larger than the first supply current.

14. A Voltage-Controlled Oscillator (VCO) comprising:
an oscillator;
a supply regulation control loop circuit configured to receive a control signal from a control signal input conductor of the VCO and configured to supply a first supply current to a supply current input lead of the oscillator;
a bypass capacitor coupled to conduct a noise current from the supply current input lead of the oscillator to a ground conductor; and
means for supplying a second supply current to the supply current input lead of the oscillator such that the second supply current is substantially directly proportional to the first supply current.

15. The VCO of claim 14, wherein the means includes a replica load that substantially replicates a current-voltage characteristic (an I-V characteristic) of the oscillator.

16. The VCO of claim 14, wherein the means includes a digitally-controlled current source, and wherein the digitally-controlled current source receives a multi-bit digital control signal.

17. The VCO of claim 14, wherein the second supply current is substantially greater than the first supply current.

18. The VCO of claim 14, wherein the control signal is a voltage control signal that controls an oscillating frequency of the oscillator.

19. A Voltage-Controlled Oscillator (VCO) comprising:
a control signal input conductor;
a first oscillator having a supply current input lead;
a second oscillator having a supply current input lead, wherein the second oscillator is injection-locked to the first oscillator, wherein the first oscillator is operable to output an oscillating signal that is supplied to the second oscillator; and
a supply regulation control loop circuit configured to receive a control signal from the control signal input conductor and configured to supply a first supply current to the supply current input lead of the first oscillator and to supply a second supply current to the supply current input lead of the second oscillator.

20. The VCO of claim 19, further comprising:
a bypass capacitor coupled to conduct a noise current from the supply current input lead of the second oscillator to a ground conductor.

21. The VCO of claim 19, wherein the second supply current is substantially directly proportional to the first supply current.

22. The VCO of claim 19, wherein the supply regulation control loop circuit comprises:

a first transistor configured to supply the first supply current to the first oscillator;

a second transistor configured to supply the second supply current to the second oscillator; and an operational amplifier, wherein an output lead of the operational amplifier is coupled to a gate of the first transistor and is coupled to a gate of the second transistor.

23. The VCO of claim 19, wherein the supply regulation control loop circuit comprises:

a transistor having a gate and a drain, wherein the drain is coupled to the supply current input lead of the first oscillator; and an operational amplifier, wherein an output lead of the operational amplifier is coupled to the gate of the transistor, wherein a first input lead of the operational amplifier is coupled to the control signal input conductor, and wherein a second input lead of the operational amplifier is coupled to the drain of the transistor.

24. A method of operating a Voltage-Controlled Oscillator (VCO) comprising:

receiving a control signal onto a supply regulation control loop circuit from a control signal input conductor;

supplying a first supply current from the supply regulation control loop circuit to a supply current input lead of a first oscillator;

supplying a second supply current from the supply regulation control loop circuit to a supply current input lead of a second oscillator, wherein the second oscillator is injection-locked to the first oscillator;

outputting an oscillating signal from the first oscillator;

supplying the oscillating signal to the second oscillator; and conducting a noise current through a bypass capacitor from the supply current input lead of the second oscillator to a ground conductor, wherein the control signal input conductor, the supply regulation control loop circuit, the first oscillator, the second oscillator, and the bypass capacitor are parts of the VCO.

25. The method of operating the VCO of claim 24, wherein the first supply current is substantially directly proportional to the second supply current.

26. The method of operating the VCO of claim 24, wherein the supply regulation control loop circuit comprises:

a first transistor configured to supply the first supply current to the first oscillator;

a second transistor configured to supply the second supply current to the second oscillator; and an operational amplifier, wherein an output lead of the operational amplifier is coupled to a gate of the first transistor and is coupled to a gate of the second transistor.

27. The method of operating the VCO of claim 24, wherein the VCO is a part of a Phase-Locked Loop (PLL), the method further comprising:

supplying the oscillating signal to a feedback divider of the PLL.

28. A Voltage-Controlled Oscillator (VCO) comprising:

a control signal input conductor;

a first oscillator having a supply current input lead;

a second oscillator having a supply current input lead, wherein the second oscillator is injection-locked to the first oscillator and the first oscillator is operable to output an oscillating signal that is supplied to the second oscillator; and means for receiving a control signal from the control signal input conductor and for supplying a first supply current to the supply current input lead of the first oscillator and for supplying a second supply current to the supply current input lead of the second oscillator such that the second supply current is substantially directly proportional to the first supply current, wherein the control signal input conductor, the first oscillator, the second oscillator, and the means are parts of the VCO.

29. The VCO of claim 28, wherein the first oscillator is further operable to supply the oscillating signal to a feedback divider of a Phase-Locked Loop (PLL).

30. The VCO of claim 28, wherein the VCO receives the control signal via the control signal input conductor from a loop filter of a Phase-Locked Loop (PLL).

31. The VCO of claim 28, wherein the means includes a first transistor, a second transistor, and an operational amplifier, wherein the first transistor is operable to supply the first supply current to the first oscillator, wherein the second transistor is operable to supply the second supply current to the second oscillator, and wherein an output lead of the operational amplifier is coupled to a gate of the first transistor and to a gate of the second transistor.

* * * * *